(12) United States Patent
Zeng et al.

(10) Patent No.: US 10,073,506 B2
(45) Date of Patent: Sep. 11, 2018

(54) METHOD AND SYSTEM FOR TESTING CIRCUIT

(71) Applicant: DELTA ELECTRONICS, INC., Taoyuan Hsien, Taiwan (CN)

(72) Inventors: Jianhong Zeng, Taiwan (CN); Ziying Zhou, Taiwan (CN); Haoyi Ye, Taiwan (CN); Peiqing Hu, Taiwan (CN)

(73) Assignee: DELTA ELECTRONICS, INC., Taoyuan Hsien, Taiwan (CN)

( * ) Notice: Subject to any disclaimer, the term of this patent is extended or adjusted under 35 U.S.C. 154(b) by 176 days.

(21) Appl. No.: 14/868,566

(22) Filed: Sep. 29, 2015

(65) Prior Publication Data
US 2016/0195580 A1     Jul. 7, 2016

(30) Foreign Application Priority Data
Jan. 4, 2015  (CN) .......................... 2015 1 0001617

(51) Int. Cl.
| | |
|---|---|
| *G01R 31/20* | (2006.01) |
| *G01R 31/26* | (2014.01) |
| *G06F 1/26* | (2006.01) |
| *G01R 31/40* | (2014.01) |
| *G06F 1/28* | (2006.01) |
| *G01R 19/165* | (2006.01) |

(52) U.S. Cl.
CPC ............... *G06F 1/26* (2013.01); *G01R 31/40* (2013.01); *G06F 1/28* (2013.01); *G01R 19/16552* (2013.01)

(58) Field of Classification Search
CPC ............ G06F 1/26; G01R 31/40; G01R 19/16

USPC ........... 324/750.01, 754.03, 762.01; 323/909
See application file for complete search history.

(56) References Cited

U.S. PATENT DOCUMENTS

| | | | |
|---|---|---|---|
| 5,875,103 A | 2/1999 | Bhagwat et al. | |
| 5,917,318 A * | 6/1999 | Kamata ............... | G01R 1/20 323/909 |
| 6,400,590 B2 | 6/2002 | Hickman | |
| 2004/0124827 A1* | 7/2004 | Winn ............... | G01R 31/2884 324/76.39 |

FOREIGN PATENT DOCUMENTS

| | | |
|---|---|---|
| CN | 102467217 A | 5/2012 |
| JP | 2013-206090 A | 10/2013 |

(Continued)

OTHER PUBLICATIONS

1st Office Action dated Jan. 6, 2017 by the TW Office.
The 1st Office Action issued in the counterpart CN application No. 201510001611.X dated Jan. 25, 2018, by the SIPO.

*Primary Examiner* — Farhana Hoque
(74) *Attorney, Agent, or Firm* — Yunling Ren

(57) ABSTRACT

The present disclosure generally relates to a test method and system thereof. The test method comprises: outputting a test control signal to a test power supply of the circuit under test so as to adjust an input signal of the circuit under test so that a gain range of the circuit under test in an abnormal operating state is the same as that of the circuit under test in a normal operating state when the circuit under test enters into the abnormal operating state. The present disclosure may meet requirements for equipment test without sacrificing the efficiency of circuits in normal operating state or adding complexity circuit.

21 Claims, 15 Drawing Sheets

(56) References Cited

FOREIGN PATENT DOCUMENTS

| TW | 452727 B | 9/2001 |
|----|----------|--------|
| TW | 200841575 A | 10/2008 |
| TW | I461893 B | 11/2014 |

\* cited by examiner

METHOD AND SYSTEM FOR TESTING CIRCUIT

TECHNICAL FIELD

The present disclosure generally relates to power supply test, and more particularly, to a test method and system thereof.

BACKGROUND

With improvement of human requirements for an intelligent life, a requirement for data processing is increasing. Global energy consumption on data processing reaches hundreds of billions of KWH or even trillions of KWH every year. And a large-scale data center covers an area of ten thousands of square meters. Therefore, key indicators for sound development of this industry include high efficiency, high power density and high reliability.

A key element of a data center is a server whose mainboard generally comprises data processing chips such as a CPU, Chipsets, and a Memory, a power supply and requisite peripheral components. FIG. 1 is a schematic diagram of a mainboard power supply. As shown in FIG. 1, the cascade mainboard power supply at different stages on a mainboard receives an input of a power bus and converts it into different outputs so as to provide it for various loads. For example, as shown in FIG. 1, the mainboard power supply receives an input of 400V and converts it into a first output (e.g., 48V) by means of a first-stage converter circuit (400V-48V in FIG. 1). A second-stage converter circuit (e.g., 48V-12V and 48V-Vo in FIG. 1) cascaded with the first-stage converter circuit receives the first output and converts it into a second output, and directly provides the second output for different loads (e.g., a hard disc or a fan, etc.) according to the value of the second output. Or, the second output may be further converted into a third output by means of a third stage circuit (e.g., 12V-Vo) so as to provide it for the corresponding loads.

The mainboard power supply and loads may be subject to test in order to ensure their stability and reliability. FIG. 2 is a schematic diagram of a test system of the mainboard as shown in a conventional test in FIG. 1. As shown in FIG. 2, the equipment under test (E.U.T.) generally comprises a main circuit and a control circuit, and is configured to receive an input signal from a test power supply and provide an output to a load. The test control circuit is configured to send a control signal for controlling the E.U.T. Within a normal operating range of a load, the E.U.T. (e.g., it is converter circuits at different stages on a mainboard) needs to provide a certain corresponding output. In addition, the converter circuit should provide an output with wider range than the normal operating range in order to test the stability of different kinds of load and the whole mainboard power supply. For example, supposing an output Vo of the third stage circuit (12V-Vo) as shown in FIG. 1 is 5V. Typically, the normal output voltage range is 5±5% V. In addition, generally the circuit voltage output range should be 5±15% V (for example) in order to test the stability of a load under different voltages. Thus, the output range of a circuit in the test state is much wider than the range in its normal operating state, i.e., as to the same input range, the gain range in the test state is much wider than the gain range in the normal operating state. It is unavoidable to sacrifice normal operating efficiency in order to ensure normal operation of a circuit in the test state. This is because the wider the gain range is, the lower the circuit efficiency is. Or extra means (e.g., more complex circuit structures, etc.) are required for acquiring higher circuit efficiency in the normal operation.

SUMMARY

In order to solve the above problems, the present disclosure provides a test method and system thereof, which may meet requirements for power supply test without sacrificing the circuit efficiency in a normal operating state and adding circuit complexity.

According to an aspect of the present disclosure, a test method is provided, comprising: when the equipment under test enters into the abnormal operating state, wherein the equipment under test comprises a circuit under test, outputting a test control signal to a test power supply of the circuit under test so as to adjust an input signal of the circuit under test so that a gain range of the circuit under test in the abnormal operating state is substantially the same as that of the circuit undertest in a normal operating state.

According to another aspect of the present disclosure, a test system is provided, comprising: an equipment under test comprising a circuit under test; a test power supply configured to provide an input signal for the equipment under test; and a test control circuit configured to output a test control signal to the test power supply so as to adjust an input signal of the equipment under test so that a gain range of the equipment under test in the abnormal operating state is substantially the same as that of the equipment under test in a normal operating state when the equipment under test enters into the abnormal operating state.

The test method provided by the present disclosure makes it possible that the gain range in an abnormal operating state is the same as that in a normal operating state while the equipment under test meets test requirements, thus reducing the complexity of circuit design and improving circuit efficiency during the normal operation. It is possible to realize modification and amendment of the present disclosure without departing from the spirit and scope of novel concept of the present disclosure. However, these and other solutions of the present disclosure will become more apparent in combination with following drawings and following preferred embodiments.

BRIEF DESCRIPTION OF THE DRAWINGS

Drawings show one or a plurality of embodiments of the present disclosure for description of the principle of the present disclosure together with written description. If possible, the same reference numbers throughout drawings represent the same or similar elements in embodiments, wherein.

DESCRIPTION OF THE EMBODIMENTS

Figure 1:
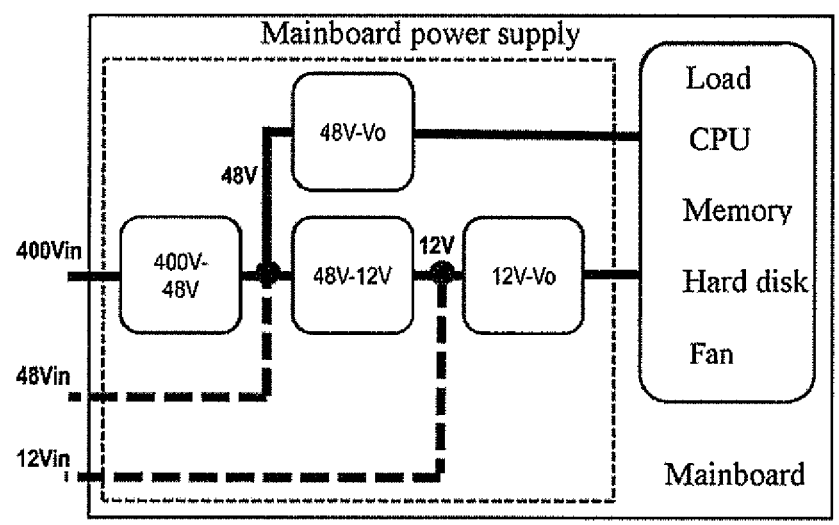
FIG. 1 is a schematic diagram of a mainboard power supply.

Description of specific embodiments of the disclosure is made in detail as below. It should be noted that embodiments described herein are only for illustration, and are not restrictive of the present disclosure.

Reference will be made in detail to the present disclosure hereinafter in combination with drawings (showing exemplary embodiments of the present disclosure). However, the present disclosure may be implemented in various different forms, and the present disclosure may not be interpreted as restrictive of embodiments of the present disclosure. More properly speaking, the present disclosure will be deep and complete by providing these embodiments, and the scope of the present disclosure will be comprehensively conveyed to those of ordinary skill in the art. Similar reference numbers throughout drawings represent similar elements.

Terms used herein are only for illustration of specific embodiments and are not inclined to restrictive of the present disclosure. The singular form "one (a, an, the)" used herein intends to also include the plural form unless otherwise clearly specified. It should also be understood that terms "include" and/or "comprise", "contain" and/or "containing", or "have" and/or "is provided with" used herein indicate existence of characteristics, areas, integers, steps, operations, elements and/or components, but are not exclusive of existence or adjunction of one or a plurality of other characteristics, areas, integers, steps, operations, elements, components and/or combination thereof.

Unless otherwise defined, all terms (including technical terms and scientific and technological terms) used herein have the same meanings as usually comprehended by those of ordinary skill in the art. It is also to be understood that in addition to what is specifically defined herein, terms (e.g., terms as defined in a general dictionary) shall be interpreted as meanings consistent with meanings in related technologies and the present disclosure instead of idealized or formalized meanings.

The equipment under test comprises a circuit under test. The conception of the present disclosure is as below: when the equipment under test enters into the abnormal operating state, a test control signal would be provided to a test power supply of the circuit under test so as to adjust an input signal of the circuit under test so that a gain range of the circuit under test in an abnormal operating state is substantially the same as that of the circuit under test in a normal operating state. The abnormal operating state may be either a test state or other states under abnormal operation, e.g. a hold-up time state. The gain range is substantially the same does not mean that the gain range should be absolutely identical, and the gain range with some tolerance is also substantially the same range. For example, for a first gain range with the maximum value A and the minimum value B, that is to say, B≤gain 1≤A, the second gain range (A*(1+tolerance 1)≤gain 2≤B*(1+tolerance 2)) with some tolerance of its maximum or minimum value is a substantially the same range with the first range. Herein, tolerance 1 and 2 may have a range from −15% to 15%, or preferably −10% to 10%, or even more preferably 5%. And tolerance 1 and 2 may be same or different.

Figure 2:
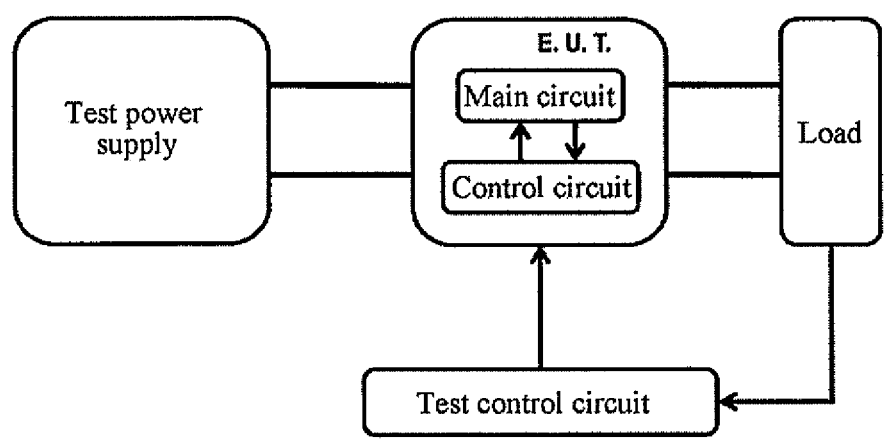
FIG. 2 is a schematic diagram of a test system of the mainboard as shown in a conventional test in FIG. 1.
Figure 3:
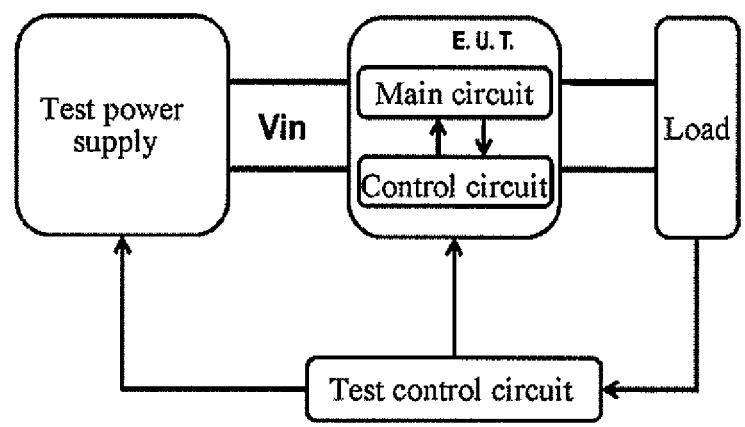
FIG. 3 is a schematic diagram of a test system according to an embodiment of the present disclosure.

The difference between the test system in the present disclosure and a conventional test system is described hereinafter in combination with drawings and by taking a test state as an example of an abnormal operating state. FIG. 3 shows an embodiment of the present disclosure. The difference between the test system as shown in FIG. 3 and the conventional test system as shown in FIG. 2 lies in the following; the test control circuit in the test system not only provides test control signal to an E.U.T. but also provides test control signal to a test power supply during a test. Thus, in the test state, the equipment under test may operate within a gain range which is substantially the same as that in a normal operating state by controlling the test power supply and the E.U.T., so that the requirements at normal operation and those under test condition are both met. During the test condition, the input voltage of the E.U.T. will be adjusted according to its output voltage so that the gain range of the equipment under test in the test state is substantially the same as that of the equipment under test in a normal operating state.

The test power supply and the equipment under test will be described one by one hereinafter.

The test power supply may be an external power supply of the circuit under test or an output of a preceding-stage circuit of the equipment under test. However, the present disclosure is not limited to this.

Figure 4:
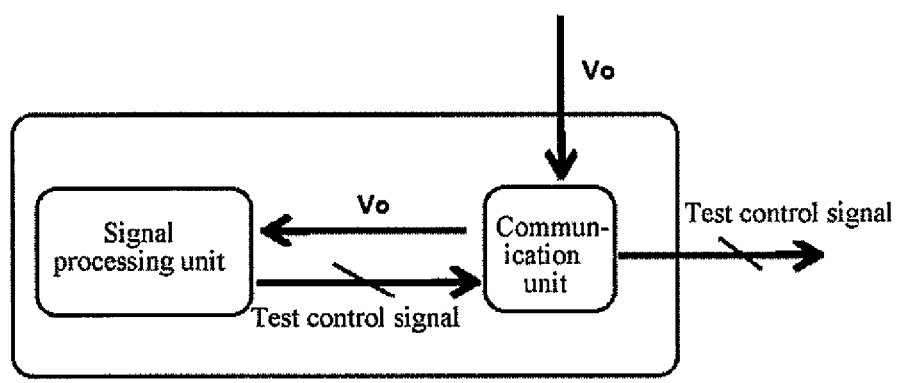
FIG. 4 is a schematic diagram of a test control circuit according to an embodiment of the present disclosure.

In an implementation, the test control circuit may be an external device configured to send a test control signal. For example, as shown in FIG. 4, the test control circuit comprises a signal processing unit and a communication unit. The communication unit receives an output signal (e.g., an output voltage Vo) from the equipment under test and sends it to the signal processing unit. The signal processing unit outputs a corresponding test control signal to the communication unit after performing an operational process. The communication unit then respectively provides a corresponding test control signal to the equipment under test and the test power supply. The signal processing unit may be a digital processor, such as a DSP or a MCU, etc.

In the present disclosure, in order to meet test requirements of the equipment under test and requirements for acquiring higher circuit efficiency in the normal operating state without adding circuit complexity, a control signal outputted by the test control circuit as shown in FIG. 3 may control the magnitude of an input voltage Vin. In the test state of the equipment under test, the control signal of the test system may adjust the magnitude of the input voltage Vin according to the required output voltage so as to ensure that the equipment under test generates a corresponding output within a gain range which is substantially the same as that in a normal operating state.

In combination with FIG. 6 and FIG. 7, it will be explained hereinafter how to adjust the input voltage of E.U.T according to its output voltage so that the operating range of the equipment under test in the test state is substantially the same as that of the equipment under test in the normal operating state.

Figure 5:
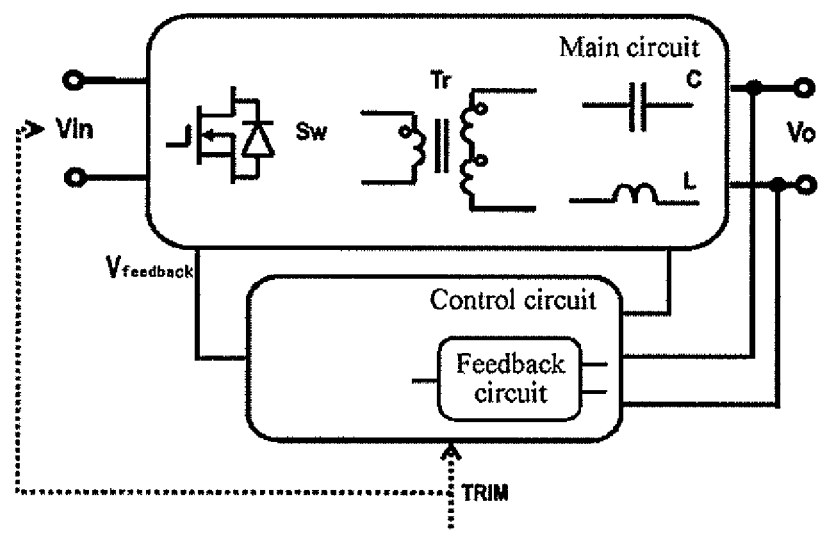
FIG. 5 is a circuit diagram of the equipment under test according to an embodiment of the present disclosure.
Figure 6:
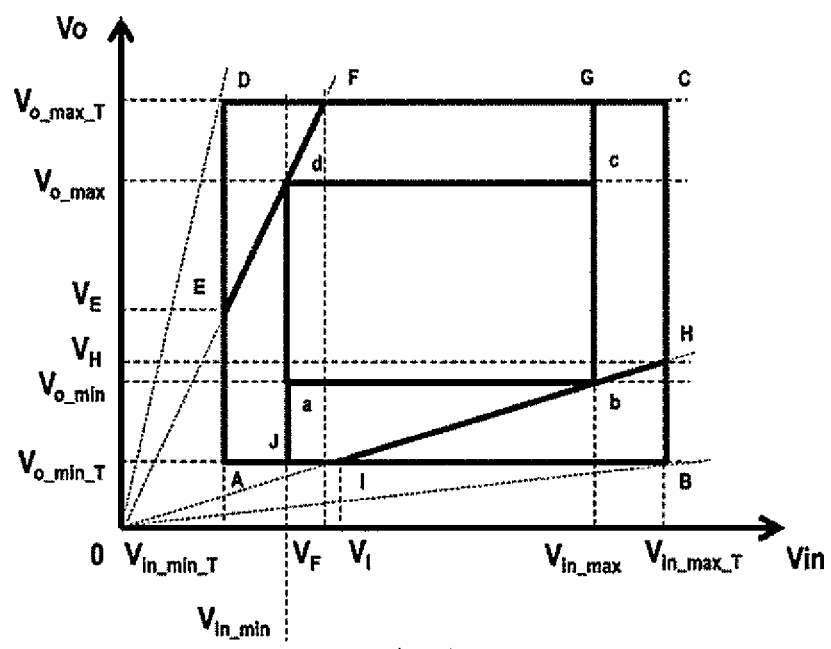
FIG. 6 is a diagram showing a relationship between an input and an output of the equipment under test according to an embodiment of the present disclosure.

FIG. 6 is a diagram showing a relationship between an input and an output of the equipment under test as shown in FIG. 5. As shown in FIG. 6, the horizontal axis is the input voltage Vin and the vertical axis is the output voltage Vo. The gain is equal to Vo/Vin, and thus the slope of each point in FIG. 6 is the gain of the point.

In FIG. 6, Vin_min~Vin_max is the input voltage range during an normal operation, Vo_min~Vo_max is the output voltage range during the normal operation, Vin_min_T~Vin_max_T is the input voltage range in the test state, and Vo_min_T~Vo_max_T is the output voltage range in the test state. Herein, the input voltage range in the test state may be the same as or larger than that in the normal operating state. Thus, in the normal operating state, a circuit operating area is Area a-b-c-d and its gain range is the slope range from a radial line $0b$ to a radial line $0d$. In the test state, a circuit working area is Area A-B-C-D and its gain range is the slope range from a radial line $0B$ to a radial line $0D$. It can be seen from FIG. 6 that the operating range of the equipment under test in the test state is much wider than that of the equipment under test in the normal state. Thus it is unavoidable to sacrifice the normal operating efficiency in order to ensure the normal operation of the circuit in the test state.

Therefore, according to the control method as shown in FIG. 3 and FIG. 5 in the present disclosure, by adjusting the input voltage, the equipment under test in the test state may still operate within the gain range in the normal operating state, and the requirements in the test state are also met.

According to an embodiment of the present disclosure, as shown in FIG. 6, Area E-F-C-H-I-A-E should be the circuit operating range in the test state. In the area, the input voltage range is Vin_min_T~Vin_max_T, the output voltage range is Vo_min_T~Vo_max_T, and the gain range is the slope range from a radial line $0b$ to a radial line $0d$. The input voltage is correspondingly adjusted according to the output voltage range so as to meet the condition which the equipment under test in the test state can still operate within the gain range in the normal operating state. The embodiment as shown in FIG. 6 is taken as an example to illustrate how to adjust the input voltage according to different output voltage ranges.

(1) When the output voltage is Vo_min~Vo_max, the input voltage range may still be within Vin_min~Vin_max or be correspondingly adjusted according to different output voltages. For example, when the output voltage range is VH~VE or VE~VH (the relative magnitude between VE and VH is undetermined), the input voltage range is Vin_min_T~Vin_max_T. When the output voltage range is VE~Vo_max, the maximum value of the input voltage is Vin_max_T, and the minimum value of the input voltage may vary from Vin_min_T to Vin_min according to the variation of input voltage. When the output voltage range is Vo_min~VH, the minimum value of the input voltage is Vin_min_T, and the maximum value of the input voltage may change from Vin_max to Vin_max_T according to the variation of input voltage, wherein VE=(Vin_min_T×Vo_max)/(Vin_min) and VH=(Vin_max_T×Vo_min)/(Vin_max).

(2) When the output voltage range is Vo_max~Vo_max_T, the maximum value of the input voltage is Vin_max_T, and the minimum value of the input voltage may vary from Vin_min to VF correspondingly according to the output voltage, i.e., when the output voltage is Vo_max_T, the input voltage must be greater than or equal to VF and smaller than or equal to Vin_max_T so as to ensure that the gain range in the test state does not exceed the gain range in the normal state, wherein VF=(Vin_min×Vo_max_T)/(Vo_max).

(3) When the output voltage range is Vo_min_T~Vo_min, the minimum value of the input voltage is Vin_min_T, and the maximum value of the input voltage may vary from VI to Vin_max correspondingly according to the output voltage, i.e., when the output voltage is Vo_min_T, the input voltage must be smaller than or equal to VI and greater than or equal to Vin_min_T so as to ensure that the gain range in the test state does not exceed the gain range in the normal state, wherein VI=(Vin_max×Vo_min_T)/(Vo_min).

According to an embodiment of the present disclosure, in the test state, if the input voltage range still is Vin_min~Vin_max, corresponding operating range changes to Area d-a-J-I-b-c-G-F-d. Corresponding input and output voltage ranges may be acquired according to FIG. 6 and what is mentioned above.

Of course, the operating range varies according to different input and output voltages conditions. FIG. 7 shows another embodiment of the present disclosure. The difference between FIG. 6 and FIG. 7 is: in FIG. 6 VE>VH while in FIG. 7 VH>VE. Area E-F-C-H-I-A-E is the circuit operating range during the test state. In FIG. 7, when the output voltage is Vo_min_T, the input voltage must be accordingly smaller than or equal to VI and greater than or equal to Vin_min_T so as to ensure that the gain range in the test state does not exceed that in the normal state, wherein VI=(Vin_max×Vo_min_T)/(Vo_min). When the output voltage is Vo_max_T, the input voltage must be accordingly greater than or equal to VF and smaller than or equal to Vin_max_T so as to ensure that the gain range in the test state does not exceed that in the normal state, wherein VF=(Vin_min×Vo_max_T)/(Vo_max). According to an embodiment of the present disclosure, VI<Vin_min_T if variation range of the input voltage is much greater than the output voltage range; when input voltage is equal to Vin_min_T, the output voltage may range from Vo_min_T to VE for example. Thus, the gain range in the test state still does not exceed the gain range in the normal state.

For example, when a battery-powered DC/DC converter is under a normal operation, its input voltage range is from 43V to 57V, and the rated input voltage is 54.3V. Supposing its load is a hard disc (for example), the rated output voltage generally is 12V, and the normal output voltage range is about ±5% (ranging from 11.4V to 12.6V). And in the test state, its output voltage range is about ±30% (ranging from 8.4V to 15.6V), and its input voltage range is about from 38V to 60V. Then the gain (Vo/Vin) ranges from 0.200 to 0.293 in the normal state. And the gain during the test state will range from 0.147 to 0.363 if the input voltage range in the test state is the same as the input voltage range in the normal state; the gain ranges from 0.140 to 0.411 if the input voltage range is enlarged during the test condition. Anyhow, the gain range in the test state is wider than the gain range in normal operating state. Thus, it is possible to adopt the method in FIGS. 3-6. If the output voltage range in the test state is the same as the output voltage range in the normal state, the input voltage during the test condition can be within the same input voltage range in the normal state; when the output voltage is greater than 12.6V or smaller than 11.4V, the input voltage is adjusted so that circuit gain does not exceed the gain range (0.200~0.293) in the normal state, thus a high efficiency circuit during the normal state can be gotten. In such a situation, VF=53.2V, VI=42V, VE=11.13V and VH=13.26V. At the moment, as VI<Vin_min_T, the corresponding output voltage ranges from 8.4V to 11.13V if the input voltage is equal to Vin_min_T=43V. Thus, the gain range in the test state still does not exceed the gain range in the normal state. When the output voltage is 15.6V, the input voltage must be accordingly greater than or equal to 53.2V and smaller than 57V so as to ensure that the gain range in the test state does not exceed the gain range in the normal state.

The main circuit in the equipment under test may be any type of circuit, for example, a PFM circuit or a PWM circuit such as a Buck circuit, a Boost circuit, a Buck-Boost circuit, a Flyback circuit, a Half-bridge circuit, a resonant circuit or a Phase-shift full bridge circuit, etc.

Figure 7:
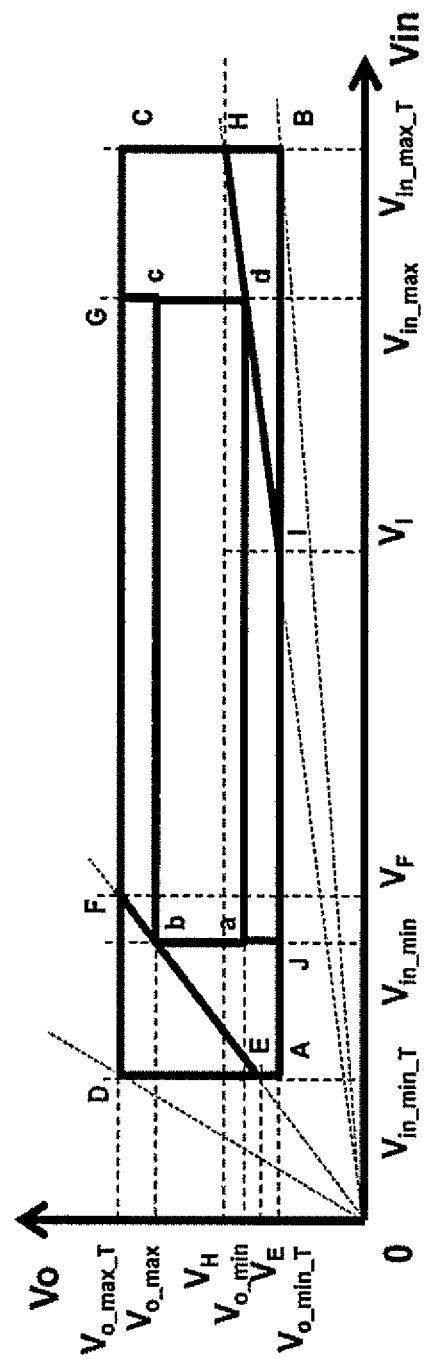
FIG. 7 is a diagram showing a relationship between an input and an output of the equipment under test according to another embodiment of the present disclosure.

Herein, the specific operation of the control method in FIG. 6 and FIG. 7 may be accomplished by using the test control circuit as shown in FIG. 4.

FIG. 5 shows a specific structure of the equipment under test (E.U.T.) as shown in FIG. 3. The equipment under test as shown in FIG. 5 is a regulated circuit, comprising a main circuit and a control circuit. Herein, the regulated circuit is characterized by a variable circuit gain Vo/Vin. For example, the output voltage of the regulated circuit is almost constant, so the gain varies correspondingly according to the variation of input voltage.

The main circuit of the equipment under test receives an input voltage Vin of the test power supply, and converts the input voltage Vin into an output voltage Vo by means of a combination of active components (e.g., a switch Sw), passive components (e.g., an inductor L and/or a capacitor C) and/or a transformer, etc.

The control circuit of the equipment under test may receive a signal (e.g., an output signal Vo and/or a main circuit current, etc.) provided by the main circuit as well as receive a control signal (e.g., a TRIM control signal, etc.) provided by other circuits (e.g., a test control circuit) other than the main circuit. The control circuit may generate a first control signal $V_{feedback}$ by the feedback circuit part thereof to control a component of the main circuit (for example, an active switch component of the main circuit) for changing the circuit gain, so that the gain range of the equipment under test in the abnormal operating state is substantially the same as that of the equipment under test in the normal operating state.

Figure 8:
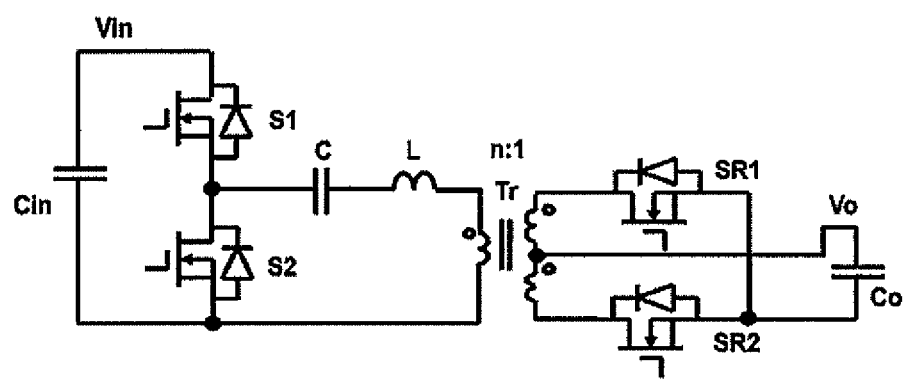
FIG. 8 is a circuit diagram of the main circuit of the equipment under test according to an embodiment of the present disclosure.

FIG. 8 is a circuit diagram of a main circuit of the equipment under test. As shown in FIG. 8, the main circuit is a PFM circuit, i.e., an LLC resonant circuit. In the LLC resonant circuit shown in FIG. 8, a bridge arm comprising two switches S1 and S2 connected in series is connected in parallel with an input capacitor Cin for receiving an input voltage Vin; a resonant network comprising an inductor L, a capacitor C and a primary side of a transformer Tr is connected in parallel with the ends of the switch S2; and, a secondary side of the transformer comprises two windings respectively connected to synchronous rectifiers SR1 and SR2, thus constituting a full-wave rectification circuit and generating an output voltage Vo on an output capacitor Co.

Regarding to the equipment under test comprising the main circuit as shown in FIG. 8, the switch frequency of its switches S1 and S2 may be adjusted thus further adjusting its gain range.

Figure 9:
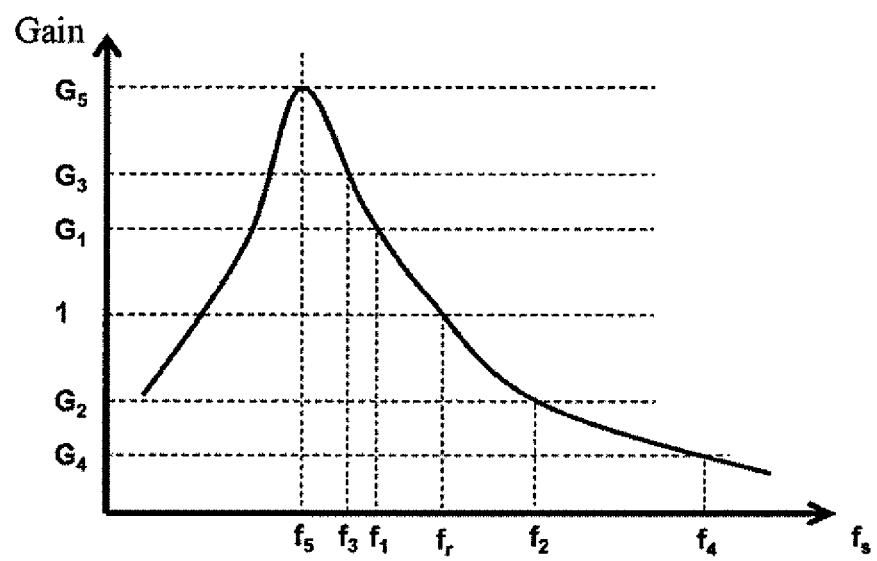
FIG. 9 is a gain curve chart of the main circuit as shown in FIG. 8.

FIG. 9 is a gain curve chart of the equipment under test comprising the main circuit as shown in FIG. 8. As shown in FIG. 9, the abscissa is normalized frequency (i.e., ratio of switch frequency fs of switches S1 and S2 to resonance frequency fr), the ordinate is circuit gain n*Vo/Vin, wherein n is turn ratio of the transformer. Area 1 (i.e., G2≤Gain≤G1) is gain range in the normal operating state, corresponding frequency range is f1≤fs≤f2; Area 2 (i.e., G4≤Gain≤G3) is gain range in the test state in the prior art, corresponding frequency range is f3≤fs≤f4. It can be known from FIG. 9 that in the prior art, the operating frequency range in the test condition is much wider than the frequency range in the normal operating state in order to meet test condition. Such a wide operating range inevitably reduces the normal operating efficiency. Furthermore, when the gain range is G4≤Gain≤G5 and its corresponding operating frequency range is f5≤fs≤f4, the circuit enters into a capacity area, and thus the circuit is unable to operate safely.

In order to avoid this situation, the control method and system thereof as shown in FIG. 3 and FIG. 5 are employed in the present disclosure. When the circuit operates in the test state, the input signal (such as an input voltage) is adjusted so that circuit gain in the test state is still within the gain range in the normal operating state. For example, the gain range of the circuit in the test state is G2≤Gain≤G1. Thus, the designed circuit may operate within a narrower gain range in comparison with prior art, higher efficiency is obtained in the normal operating state and the circuit may be avoided from working in an unsafe area.

When a circuit operates in the test state, there are many manners for adjusting an input signal. In the most direct manner, a variable power source is applied, and when it is detected that the circuit enters into the test state, the output of the variable power source is adjusted so that the gain is within the gain range in the normal operating state. At the moment, the input signal may be selected either from, for example, an input voltage range in the normal operating state or from an input voltage range in the test state.

In an actual application, the circuit under test is generally a certain-stage circuit in a system power supply. Regarding to such a test circuit, a preceding-stage circuit of the circuit under test serves as its test power supply. The test power supply herein may be interpreted as an external power supply or a preceding-stage circuit in a multistage circuit.

Figure 10:
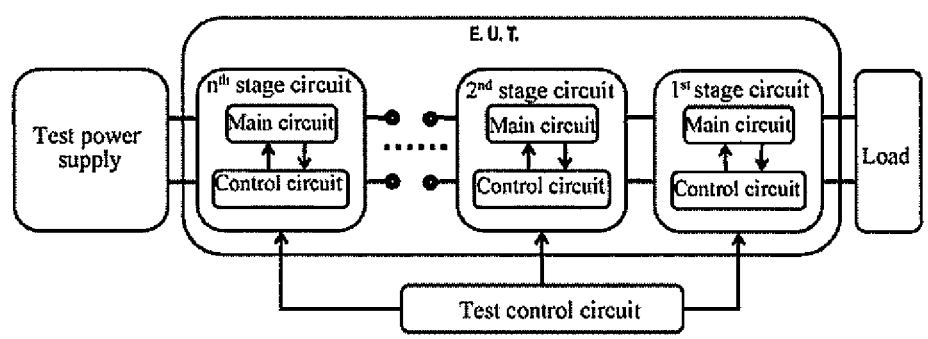
FIG. 10 is a structure diagram of a multistage cascade test system.

In a system (e.g., a mainboard power supply of a server), loads generally are supplied with power by a multistage cascade circuit. And the multistage cascade circuit is regarded as equipment under test. In such a system, each stage circuit receives an output of a preceding-stage circuit and provides the output to a succeeding-stage circuit or a load. Therefore, when the circuit under test is a one-stage circuit in a multistage cascade circuit, the input signal of the circuit under test is adjusted by adjusting an output of a preceding-stage circuit of the circuit under test. For example, the input signal of the circuit under test is adjusted by adjusting an output of any one or a plurality of preceding-stage circuits of the circuit under test. FIG. 10 shows another embodiment of the test system in the present disclosure. As shown in FIG. 10, the equipment under test comprises an n-stage (n≥2) cascade circuit to supply power to a final load, such as a CPU, a hard disc or a fan, etc. As shown in FIG. 10, at the time of entering into a test state, the test control circuit sends a control signal (reflecting whether to enter into a control state) to circuits at different stages, and the circuits at different stages generate corresponding outputs according to the control signal. Regarding to a first stage circuit directly connected to a load, the test power supply of the first stage circuit comprises the foregoing circuits at different stages, and the input of the first stage circuit is supplied with power by the output of a second stage circuit.

It should be noted that according to the embodiment as shown in FIG. 10, the input signal of the circuit under test is adjusted merely by adjusting the preceding-stage circuit of the circuit under test, so that the gain range of the circuit under test in an abnormal operating state is substantially the same as that of the circuit under test in the normal operating state. As an embodiment, the adjustment of input signal may be conducted by adjusting the test power supply of the circuit under test simultaneously, and the specific implement may refer to the manner mentioned above.

Regarding to a circuit system under test comprising two-stage or multistage cascade circuits, the circuit under test may be a one-stage circuit in the multistage cascade circuit system. The input signal of the circuit under test is an output voltage of the preceding-stage circuit of the circuit under test, and the step of adjusting the input signal of the circuit under test is achieved by adjusting an output voltage of any one stage of former-stage circuits of the circuit under test.

The circuit under test is a one-stage circuit in a multistage cascade circuit system, and the input signal of the circuit under test is an output voltage of a preceding-stage circuit of the circuit under test. The step of adjusting the input signal of the circuit under test is achieved by adjusting an output voltage of any stages of former-stage circuits of the circuit under test. And herein the former-stages whose output voltages are regulated may be two or even more than two preceding-stages of the circuit under test.

Description of multistage cascade circuits of the equipment under test is made hereinafter.

If a first stage circuit in a two-stage cascade structure is the circuit under test and the first stage circuit and a second stage circuit are a non-regulated circuit and a regulated circuit respectively, the second stage circuit receives an input signal to generate a first output, and the first stage circuit receives the first output to generate a second output and provides the second output to a load. The non-regulated circuit herein is characterized by a circuit whose gain Vo/Vin is almost constant regardless of loads. After receiving a test control signal of entering into a test state, an output of the second stage circuit is required to change in order to provide an output to a load in the test state. In this case, the second stage circuit receives the test control signal and adjusts the feedback circuit part in its control circuit so as to generate a required output and provides the output to the first stage circuit, so that the first stage circuit may provide a second output to a load within the gain range in the test state substantially the same as that in the normal state, thus testing performance (such as stability) of the load.

Assume that the first stage circuit is the circuit under test, the first stage circuit and the second stage circuit may be a regulated circuit and a non-regulated circuit respectively. In this case, it is necessary to adjust an input signal (for example, to adjust an external power output) of the second stage circuit in order to provide a corresponding first output. If there is also a third stage circuit before the second stage circuit, an output of the third stage circuit may be adjusted (i.e., the feedback circuit part of the control circuit in the third stage circuit is adjusted), so that the first stage circuit generates a required output within a gain range substantially the same as that in the normal state. According to another embodiment of the present disclosure, the feedback circuit of the first stage circuit may be simultaneously adjusted so that the first stage circuit generates a required output within a gain range substantially the same as that in the normal state.

Assume that the first stage circuit is the circuit under test, if both the first stage circuit and the second stage circuit are regulated circuits, after they respectively receive a control signal (indicating of entering into a test state) provided by the system, the second stage circuit may adjust its feedback circuit to generate a first output signal within the input range of the first stage circuit, so that the first stage circuit generates the required output within a gain range substantially the same as that in the normal state. According to another embodiment of the present disclosure, the feedback circuit of the first stage circuit may be simultaneously adjusted so that the first stage circuit generates the required output within a gain range substantially the same as that in the normal state.

Assume that the equipment under test is an n-stage (n≥3) cascade circuit system and supplies power to a final load, if the first stage circuit in the equipment under test is a regulated circuit, in the test state, the feedback circuits of one or a plurality of the regulated circuits from a second stage circuit to an $n^{th}$ stage circuit are adjusted so that the first stage circuit generates a required output within a gain range substantially the same as that in the normal state. The feedback circuit of the first stage circuit may be simultaneously adjusted so that the first stage circuit generates a required output within the gain range substantially the same as that in the normal state. If the first stage circuit is a non-regulated circuit, in the test state, feedback circuits in one or a plurality of the regulated circuits from the second stage circuit to an $n^{th}$ stage circuit, are adjusted so that the first stage circuit generates required output within a gain range substantially the same as that in the normal state.

As mentioned above, if the circuit under test is a one-stage circuit in a multistage cascade circuit system, the input signal of the circuit under test is an output voltage of a preceding-stage circuit of the circuit under test. The input signal of the circuit under test may be adjusted by adjusting a feedback circuit(s) of any one or a plurality of former-stage circuits so that the circuit under test generates a required output within the gain range substantially the same as that in the normal state. The above-mentioned control may be realized by means of diverse control manners.

Figure 11:
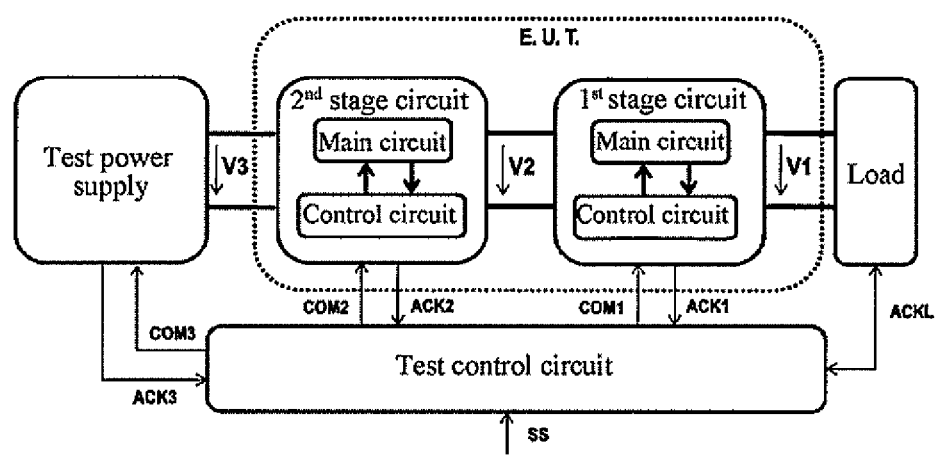
FIG. 11 is a structure adjustment schematic diagram of a two-stage cascade test system according to an embodiment of the present disclosure.
Figure 12:
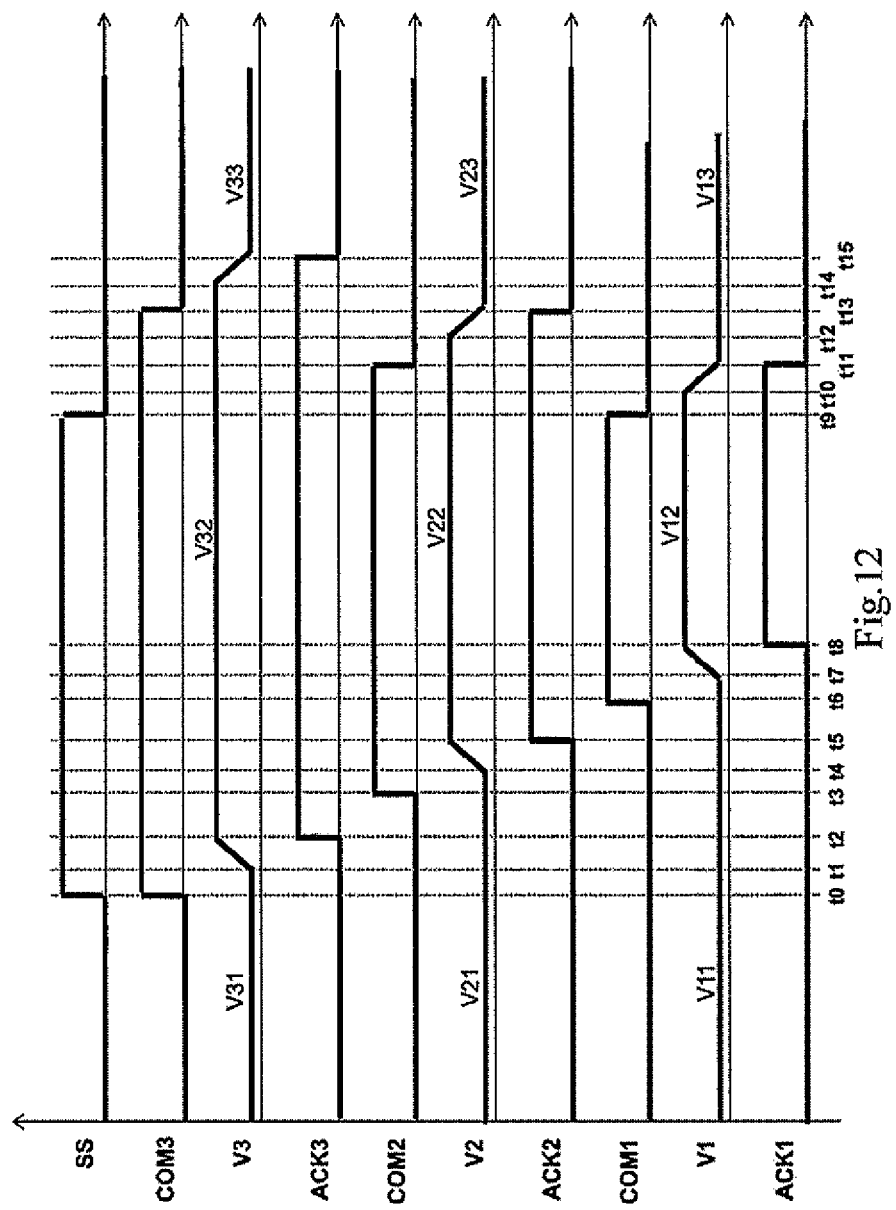
FIG. 12 is a diagram showing an adjustment sequence of the test system as shown in FIG. 11 according to an embodiment of the present disclosure.
Figure 13:
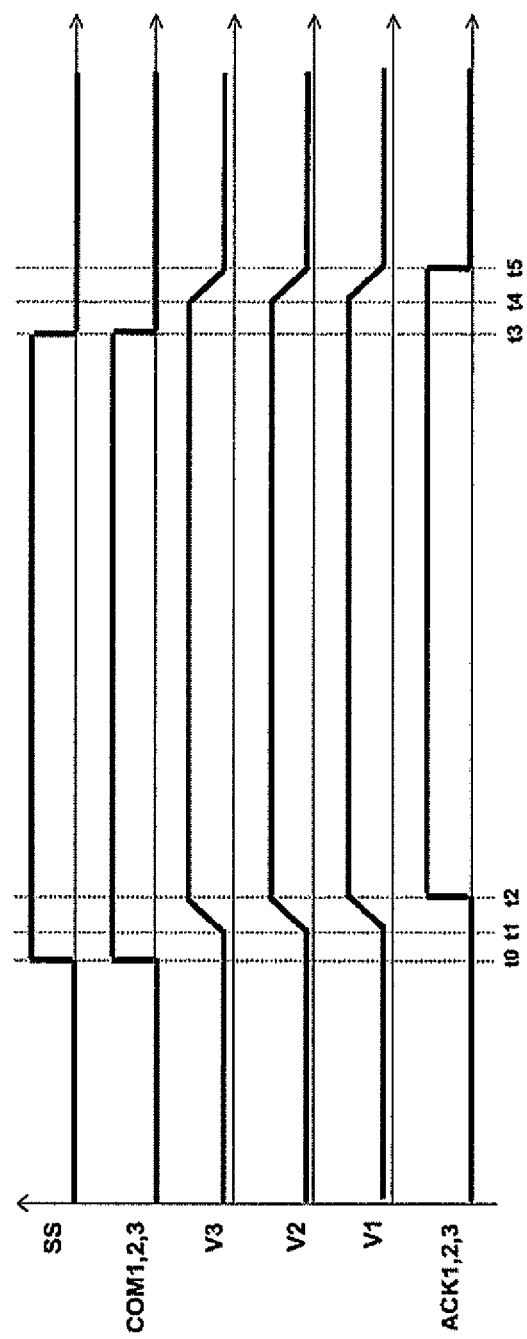
FIG. 13 is a diagram showing an adjustment sequence of the test system as shown in FIG. 11 according to another embodiment of the present disclosure.

A two-stage cascade circuit is taken as an example in combination with FIGS. 11-13 hereinafter. FIG. 11 is a diagram showing an adjustment structure of the equipment under test according to an embodiment of the present disclosure. FIG. 12 is a diagram showing an adjustment signal sequence of the test system as shown in FIG. 11 according to an embodiment of the present disclosure; and FIG. 13 is a diagram showing an adjustment signal sequence of the test system as shown in FIG. 11 according to another embodiment of the present disclosure.

As shown in FIG. 11 and FIG. 12, the test control circuit receives a system control signal SS, thus taking a corresponding test on the equipment under test or to stop testing correspondingly. At the timing t0, SS rises from low level to high level and the equipment under test enters into a test state. The test control circuit sends an adjusting signals COM3 to the test power supply, whose output V3 is accordingly changed from a first level V31 to a second level V32. At the timing t2, a response signal ACK3 sent by the test power supply to the test control circuit is changed from low level to high level, indicating the test power supply at ready. At the timing t3, an adjusting signal COM2 sent by the test control circuit to the second stage circuit is changed from low level to high level, an output V2 of the second stage circuit is changed from a first level V21 at the timing t4 to a second first level V22 at the timing t5, and at the timing t5, a response signal ACK2 sent by the second stage circuit to the test control circuit is changed from low level to high level, and said test control circuit is informed of the second stage circuit at ready. At the timing t6, an adjusting signal COM1 sent by the test control circuit to the first stage circuit is changed from low level to high level, an output V1 of the first stage circuit is changed from a first level V11 at the timing t7 to a second first level V12 at the timing t8, and at the timing t8, a response signal ACK1 sent by the first stage circuit to the test control circuit is changed from low level to high level, and the test control circuit is informed of the first stage circuit at ready. At the moment, the load will take a corresponding test.

Upon completion of the test, the system signal SS is changed from high level to low level at the timing t9, and the adjusting signal COM1 is accordingly changed from high level to low level at the timing t9, the output V1 of the first stage circuit is changed from a second level V12 at the timing t10 to a third first level V13 at the timing t11, and the response signal ACK1 is also changed from high level to low level. At the timing t11, adjusting signal COM2 is changed from high level to low level, the output V2 of the second stage circuit is changed from a second level V22 at the timing t12 to a third level V23 at the timing t13, and the response signal ACK2 is also changed from high level to low level. At the timing t13, the adjusting signal COM3 is changed from high level to low level, the output V3 of the test power supply is changed from a second level V32 at the timing t14 to a third level V33 at the timing t15, and the response signal ACK3 is also changed from high level to low level, indicating the equipment under test quits from a test state.

After entering into a test state, the test control circuit sends adjusting signals to the circuits stage by stage. A succeeding-stage circuit receives the adjusting signal after a preceding-stage circuit receives the adjusting signal and outputs a response signal indicating of getting ready. In this way, the equipment under test starts to take a test after receiving response signals sent by the circuits stage by stage from the test power supply.

In addition, at the time of entering into a test state or quitting from a test state, the test control circuit may communicate with a load through a signal ACKL so that the load gets ready for the test or quits from the test state. For example, if the load is a CPU and when the signal ACKL is changed in terms of level (e.g., changed from low level to high level) to inform the CPU of entering into a test state, the CPU may run a corresponding program in the test state.

FIG. 13 is a diagram showing another adjustment sequence corresponding to the control structure as shown in FIG. 11. The difference between FIG. 13 and FIG. 12 is as below: after the system signal SS is changed from low level to high level at the timing to, the adjusting signals COM1, COM2 and COM3 sent by the test control circuit to the test power supply and the circuits at different stages are simultaneously changed from low level to high level. At this time, the test power supply and the circuits at different stages simultaneously change their respective outputs from a first level to a second level, and the response signals ACK1, ACK2 and ACK3 sent back to the test control circuit are accordingly changed from low level to high level respectively at the timing t2, indicating that the circuits at different stages have been ready and a test is available for loads. Likewise, after system signal SS is changed from high level to low level at the timing t3, the adjusting signals COM1, COM2 and COM3 are simultaneously changed from high level to low level, and at this time, the test power supply and the circuits at different stages simultaneously change their respective outputs from the second level to a third level, and the response signal ACK1, ACK2 and ACK3 sent back to the test control circuit are accordingly changed from high level to low level respectively at the timing t5, indicating that the circuits at different stages have been ready and the system quits from the test state.

Namely, the equipment under test gets into a test after the test control circuit simultaneously sends adjusting signals to the test power supply and the circuits at different stages and simultaneously receives response signals sent by the test power supply and the circuits at different stages.

Figure 14:
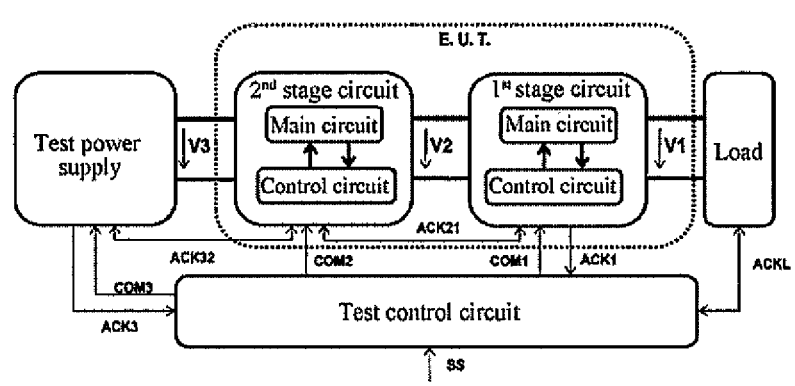
FIG. 14 is a schematic diagram showing an adjustment structure of a two-stage cascade test system according to another embodiment of the present disclosure.

FIG. 14 is a diagram showing adjustment structure of the equipment under test according to another embodiment of the present disclosure. Compared to FIG. 11, at the time of entering into a test state, response signal ACK32 which is sent by the test power supply to the test control circuit is sent to the second stage circuit so as to inform the second stage circuit whether the change has been finished, a response signal ACK21 which is sent by the second stage circuit to the test control circuit is accordingly sent to a succeeding-stage circuit (i.e., the first stage circuit) so as to inform the succeeding-stage circuit whether the change has been finished, and the first stage circuit informs the test control circuit whether the change has been finished by means of a response signal ACK1. At the time of quitting from a test state, the response signal ACK21 is provided by the first stage circuit to the second stage circuit, the response signal ACK32 is provided by the second stage circuit to the test power supply, and the test power supply provides a response signal ACK3 to the test control circuit so as to inform whether the circuits at different stages and the power supply have been ready for quitting from the test state.

In FIGS. 11-14, level values of the respective control signals merely indicate change of states thereof. Therefore, in reverse, meanings of a low level and a high level may be transposed. Additionally, the determination of the output amplitude of the test power supply and the circuits at different stages has been made clearly in description of FIG. 10, and is not repeated any more herein.

Figure 15:
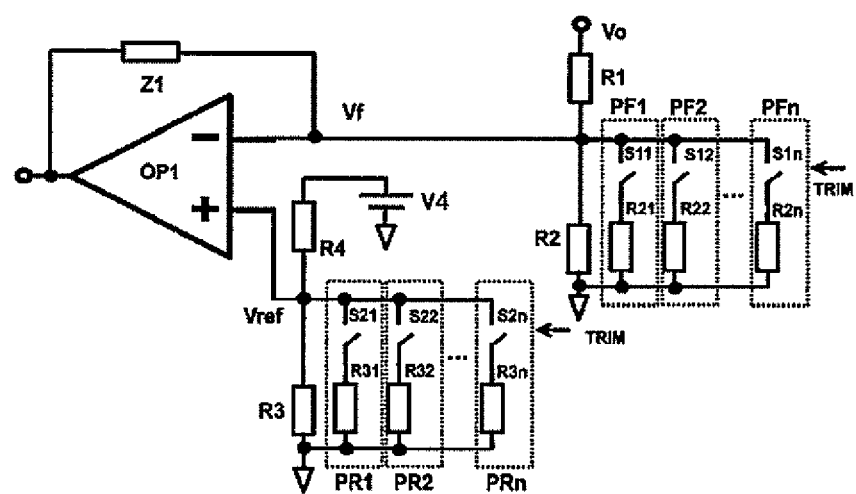
FIG. 15 is a structural diagram of a feedback circuit part of the equipment under test according to an embodiment of the present disclosure.

FIG. 15 is a schematic diagram of the feedback circuit part of the equipment under test according to an embodiment of the present disclosure. As shown in FIG. 15, the feedback circuit receives a corresponding output Vo of the main circuit and divides the voltage by means of resistors R1 and R2 connected in series, and the regulating units PF1, PF2 . . . and PFn are connected in parallel with the resistor R2. Herein, the regulating units comprise switches and resistors connected in series, for example, S11 is connected in series with R21, . . . , and S1n is connected in series with R2n, etc. R3 and R4 connected in series are connected in parallel with a voltage source V4. Regulating units PR1, PR2, . . . and PRn are connected in parallel with the resistor R3. Herein, the regulating units comprise switches and resistors connected in series, for example, S21 is connected in series with R31, . . . S2n is connected in series with R3n, etc. The inverting terminal of an operational amplifier OP1 receives an output sampling signal Vf and compares Vf with a signal Vref of the in-phase terminal thereof, thus generating corresponding feedback signal by an impedance Z1 and outputting it to other parts of the control circuit so as to control the operation (e.g., control frequency, duty cycle, phase angle and the like of a switch component) of the active switch component of the main circuit. When a circuit operates normally, S11, . . . and S1n as well as S21, . . . and S2n are off. When the circuit receives a signal TRIM indicates that the circuit is entering into a test state, the switches (e.g., S11, . . . and S1n or S21, . . . and S2n, etc.) or part of said switches are controlled to be on. In this way, the output of the feedback circuit is changed by changing the output sampling signal Vf or the reference signal Vref, and thus frequency, duty cycle and phase angle of the switches is changed so that different outputs within the output range in the test state is generated to test the performance of a load. Of course, the feedback circuit part is not limited to the analog control method as shown in FIG. 15, and other methods are also possible as long as they may achieve the same effect. For example, in the occasion of digital control, the changing of the feedback circuit may be achieved merely by correcting the value of a sampling signal or a reference signal.

The foregoing circuit under test may be any type of circuit, such as a resonance circuit or a PWM circuit, for example, a Buck circuit, a Boost circuit, a Buck-Boost circuit, a Flyback circuit, a Half-bridge circuit, or a Phase-shift full bridge circuit, etc. And the method is not limited to use in the test state. The condition is just that the output is in an abnormal operating state. The abnormal operating state mentioned herein is a state at which when input voltage of a circuit is out of the normal operating voltage range, the output voltage of the circuit is still kept within a normal voltage output range, including a hold-up time state, i.e.

Selection and description of these embodiments are for the purpose of explaining the principle and practical application of the present disclosure, thus motivating those of ordinary skill in the art to make use of the present disclosure and its embodiments as well as modifications thereof suitable for special expected use. Obviously, those of ordinary skill in the art can substitute embodiments without departing from the spirit and scope of the present disclosure. Therefore, the scope of present disclosure is limited by the appended claims instead of the foregoing specification and exemplary embodiments as described thereinto.

What is claimed is:

1. A test method, comprising:
   when an equipment under test which comprises a circuit under test enters into an abnormal operating state, outputting a test control signal to a test power supply of the circuit under test, so as to adjust an input signal of the circuit under test so that a gain range of the circuit under test in the abnormal operating state is substantially the same as that of the circuit under test in a normal operating state,
   wherein adjusting an input signal of the circuit under test so that the gain range of the circuit under test in the abnormal operating state is substantially the same as that of the circuit under test in a normal operating state comprises:
   when the circuit under test outputs the maximum output voltage Vo_max_T in the abnormal operating state, if (Vin_min_T×Vo_max)/(Vin_min)>(Vin_max_T× Vo_min)/(Vin_max), adjusting the input signal of the circuit under test to meet the following Equation (1)

$$\text{Vin\_max\_T} \geq Vin \geq \frac{\text{Vin\_min} \times \text{Vo\_max\_T}}{\text{Vo\_max}} \qquad \text{Equation (1)}$$

wherein, Vin is an input voltage of the circuit under test in the abnormal operating state, Vin_min is the minimum input voltage of the circuit under test in the normal operating state, Vin_max is the maximum input voltage of the circuit under test in the normal operating state, Vo_min is the minimum output voltage of the circuit under test in the normal operating state, Vo_max is the maximum output voltage of the circuit under test in the normal operating state, Vin_max_T is the maximum input voltage of the circuit under test in the abnormal operating state, and Vin_min_T is the minimum input voltage of the circuit under test in the abnormal operating state;

or wherein adjusting an input signal of the circuit under test so that the gain range of the circuit under test in the abnormal operating state is substantially the same as that of the circuit under test in the normal operating state comprises:
when the circuit under test outputs the minimum output voltage Vo_max_T in the abnormal operating state, if (Vin_min_T×Vo_max)/(Vin_min)>(Vin_max_T× Vo_min)/(Vin_max), adjusting the input signal of the circuit under test to meet the following Equation (2)

$$\text{Vin\_min\_T} \leq Vin \leq (\text{Vin\_max} \times \text{Vo\_min\_T})/(\text{Vo\_min}) \qquad \text{Equation (2)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_min is the minimum input voltage of the circuit under test in the normal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state;

or wherein adjusting an input signal of the circuit under test so that the gain range of the circuit under test in the abnormal operating state is substantially the same as that of the circuit under test in the normal operating state comprises:
when the circuit under test outputs the minimum output voltage Vo_min_T in the abnormal operating state, if (Vin_min_T×Vo_max)/(Vin_min)>(Vin_max_T× Vo_min)/(Vin_max), adjusting the input signal of the circuit under test to meet the following Equation (3)

$$\text{Vin\_min\_T} \leq Vin \leq (\text{Vin\_max} \times \text{Vo\_min\_T})/(\text{Vo\_min}) \qquad \text{Equation (3)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state;

or wherein adjusting an input signal of the circuit under test so that the gain range of the circuit under test in the abnormal operating state is substantially the same as that of the circuit under test in the normal operating state comprises:

when the circuit under test outputs the maximum output voltage Vo_max_T in the abnormal operating state, if (Vin_min_T×Vo_max)/(Vin_min)>(Vin_max_T×Vo_min)/(Vin_max), adjusting the input signal of the circuit under test to meet the following Equation (4)

$$(Vin\_min \times Vo\_max\_T)/(Vo\_max) \leq Vin \leq Vin\_max\_T \quad \text{Equation (4)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state.

2. The test method according to claim 1, wherein the equipment under test is a regulated circuit comprising a main circuit and a control circuit; and
the method further comprises: further outputting another test control signal to the control circuit for adjusting the gain range of the main circuit while outputting the test control signal to the test power supply of the equipment under test, so that the gain range of the equipment under test in the abnormal operating state is substantially the same as that of the equipment under test in the normal operating state.

3. The test method according to claim 1, wherein the input signal is applied by an external power supply, and adjusting the input signal of the equipment under test is realized by adjusting the external power supply.

4. The test method according to claim 1, wherein the circuit under test is a one-stage circuit in a multistage cascade circuit system, the input signal of the circuit under test is an output voltage of a preceding-stage circuit of the circuit under test, and adjusting the input signal of the circuit under test is achieved by adjusting an output voltage of any one stage of preceding-stage circuits or any two or more than two of preceding-stage circuits of the circuit under test.

5. The test method of claim 4, wherein, if the circuit under test is a regulated circuit, the gain range of the circuit under test in the abnormal operating state is made substantially the same as that of the circuit under test in the normal operating state by adjusting the input signal of the circuit under test and a feedback circuit of the circuit under test.

6. The test method according to claim 1 wherein the circuit under test is the last stage circuit in a two-stage cascade circuit system, the input signal of the circuit under test is an output voltage of a preceding-stage circuit of the circuit under test; and, if the circuit under test is a non-regulated circuit and the preceding-stage circuit is a regulated circuit, a feedback circuit of the regulated preceding-stage circuit is adjusted so that the gain range of the circuit under test in the abnormal operating state is substantially the same as that of the circuit under test in the normal operating state.

7. The test method according to claim 1, wherein the circuit under test is the last stage circuit in a two-stage cascade circuit system, the input signal of the circuit under test is an output voltage of a preceding-stage circuit of the circuit under test; and, if the circuit under test is a regulated circuit and the preceding-stage circuit is a non-regulated circuit, a feedback circuit of the circuit under test is adjusted and an input voltage of the preceding-stage circuit is adjusted so that the gain range of the circuit under test in the abnormal operating state is substantially the same as that of the circuit under test in the normal operating state.

8. The test method according to claim 1, wherein the circuit under test is the last stage circuit in a two-stage cascade circuit system, the input signal of the circuit under test is an output voltage of a preceding-stage circuit of the circuit under test; and, if both the circuit under test and its preceding-stage circuit are regulated circuits, a feedback circuit of the circuit under test and a feedback circuit of the regulated preceding-stage circuit of the circuit under test are regulated so that the gain range of the circuit under test in the abnormal operating state is substantially the same as that of the circuit under test in the normal operating state.

9. The test method according to 1, wherein the circuit under test is a one-stage circuit in a multistage cascade circuit system, and the method further comprises:
getting the circuit under test into a test state after the test control circuit sending adjusting signals to circuits at different stages stage by stage and receiving response signals sent by the circuits stage by stage.

10. The test method according to claim 1, wherein the circuit under test is a one-stage circuit in a multistage cascade circuit system, and the method further comprises:
getting the circuit under test into a test state after the test control circuit simultaneously sending adjusting signals to a test power supply and circuits at different stages; and simultaneously receiving response signals sent by the test power supply and the circuits at different stages.

11. The test method according to claim 1, wherein the circuit under test is a one-stage circuit in a multistage cascade circuit system, and the method further comprises:
getting the circuit under test into a test state after the test power supply sending a response signal to a succeeding-stage circuit connected to the test power supply and a preceding-stage circuit sending a response signal to a succeeding-stage circuit stage by stage.

12. A test system, comprising:
an equipment under test, comprising a circuit under test;
a test power supply, configured to provide an input signal for the circuit under test; and
a test control circuit, configured to output a test control signal to the test power supply, so as to adjust an input signal of the circuit under test by means of the test control signal so that a gain range of the circuit under test in the abnormal operating state is substantially the same as that of the circuit under test in the normal operating state when the circuit under test enters into the abnormal operating state,
wherein the test control circuit is further configured to:
when the circuit under test outputs the maximum output voltage Vo_max_T in the abnormal operating state, if (Vin_min_T×Vo_max)/(Vin_min)>(Vin_max_T×Vo_min)/(Vin_max), adjust the input signal of the circuit under test to meet the following Equation (1)

$$Vin\_max\_T \geq Vin \geq \frac{Vin\_min \times Vo\_max\_T}{Vo\_max} \quad \text{Equation (1)}$$

wherein, Vin is an input voltage of the circuit under test in the abnormal operating state, Vin_min is the minimum input voltage of the circuit under test in the normal operating state, Vin_max is the maximum input voltage of the circuit under test in the normal operating state, Vo_min is the minimum output voltage of the circuit under test in the normal operating state, Vo_max is the maximum output voltage of the circuit under test in the normal operating state, Vin_max_T is the maximum input voltage of the circuit under test in the abnormal operating state, and Vin_min_T is the minimum input voltage of the circuit under test in the abnormal operating state;

or wherein the test control circuit is further configured to:

when the circuit under test outputs the minimum output voltage Vo_min_T in the abnormal operating state, if (Vin_min_T×Vo_max)/(Vin_min)>(Vin_max_T×Vo_min)/(Vin_max), adjust the input signal of the circuit under test to meet the following Equation (2)

$$Vin\_min\_T \leq Vin \leq (Vin\_max \times Vo\_min\_T)/(Vo\_min) \quad \text{Equation (2)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_min is the minimum input voltage of the circuit under test in the normal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state;

or wherein the test control circuit is further configured to:

when the circuit under test outputs the minimum output voltage Vo_min_T in the abnormal operating state, if (Vin_min_T×Vo_max)/(Vin_min)<(Vin_max_T×Vo_min)/(Vin_max), adjust the input signal of the circuit under test to meet the following Equation (3)

$$Vin\_min\_T \leq Vin \leq (Vin\_max \times Vo\_min\_T)/(Vo\_min) \quad \text{Equation (3)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state;

or wherein the test control circuit is further configured to:

when the circuit under test outputs the maximum output voltage Vo_max_T in the abnormal operating state, if (Vin_min_T×Vo_max)/(Vin_min)<(Vin_max_T×Vo_min)/(Vin_max), adjust the input signal of the circuit under test to meet the following Equation (4)

$$(Vin\_min \times Vo\_max\_T)/(Vo\_max) \leq Vin \leq Vin\_max\_T \quad \text{Equation (4)}$$

wherein, Vin is an input voltage of the circuit under test in the abnormal operating state, Vin_min_T is the minimum input voltage of the circuit under test in the abnormal operating state, Vin_max_T is the maximum input voltage of the circuit under test in the abnormal operating state, Vin_max is the maximum input voltage of the circuit under test in the normal operating state, Vo_min is the minimum output voltage of the circuit under test in the normal operating state, and Vo_max is the maximum output voltage of the circuit under test in the normal operating state.

13. The test system according to claim 12, wherein the circuit under test is an regulated circuit, comprising a main circuit and a control circuit; and, when the circuit under test enters into the abnormal operating state, the test control circuit outputs a test control signal to the control circuit for adjusting a gain range of the main circuit so that the gain range of the circuit under test in the abnormal operating state is the same as that of the circuit under test in the normal operating state.

14. The test system according to claim 12, wherein the circuit under test is a one-stage circuit in a multistage cascade circuit system, the test power supply is a preceding-stage circuit of the circuit under test, the input signal of the circuit under test is an output voltage of the preceding-stage circuit of the circuit under test, and adjusting the input signal of the circuit under test is achieved by adjusting an output voltage of any one stage of preceding-stage circuits or any two or more than two of preceding-stage circuits of the circuit under test.

15. The test system according to claim 14, wherein if the circuit under test is a regulated circuit, the input signal of the circuit under test is adjusted and a feedback circuit of the circuit under test is adjusted so that the gain range of the circuit under test in the abnormal operating state is substantially the same as that of the circuit under test in the normal operating state.

16. The test system according to claim 12, wherein, the circuit under test is the last stage circuit in a two-stage cascade circuit system, the test power supply is a preceding-stage circuit of the circuit under test, and the input signal of the circuit under test is an output voltage of the preceding-stage circuit of the circuit under test; and if the circuit under test is a non-regulated circuit and the preceding-stage circuit is a regulated circuit, a feedback circuit of the regulated preceding-stage circuit is adjusted so that the gain range of the circuit under test in the abnormal operating state is substantially the same as that of the circuit under test in the normal operating state.

17. The test system according to claim 12, wherein the circuit under test is the last circuit in a two-stage cascade circuit system, the test power supply is a preceding-stage circuit of the circuit under test, and the input signal of the circuit under test is an output voltage of the preceding-stage circuit of the circuit under test; and, if the circuit under test is an regulated circuit and the preceding-stage circuit is a non-regulated circuit, a feedback circuit of the circuit under test is adjusted and an input voltage of the regulated preceding-stage circuit is adjusted so that the gain range of the circuit under test in the abnormal operating state is substantially the same as that of the circuit under test in the normal operating state.

18. The test system according to claim 12, wherein the circuit under test is the last stage circuit in a two-stage cascade circuit system, the test power supply is a preceding-stage circuit of the circuit under test, and the input signal of the circuit under test is an output voltage of the preceding-stage circuit of the circuit under test; and if both the circuit under test and the preceding-stage circuit are regulated circuits, a feedback circuit of the circuit under test and a feedback circuit of the regulated preceding-stage circuit of the circuit under test are regulated so that the gain range of the circuit under test in the abnormal operating state is substantially the same as that of the circuit under test in the normal operating state.

19. The test system according to claim 12, wherein the circuit under test is a one-stage circuit in a multistage cascade circuit system, and the circuit under test gets into a test state after the test control circuit sends adjusting signals to circuits at different stages stage by stage and receives response signals sent by the circuits at different stages stage by stage.

20. The test system according to claim 12, wherein the circuit under test is a one-stage circuit in a multistage cascade circuit system, and the circuit under test gets into a test state after the test control circuit simultaneously sends adjusting signals to a test power supply and circuits at different stages and simultaneously receives response signals sent by the test power supply and the circuits at different stages.

21. The test system according to claim 12, wherein the circuit under test is a one-stage circuit in a multistage cascade circuit system and the circuit under test gets into a test state after the test power supply sends a response signal to a succeeding-stage circuit connected to the test power supply and a preceding-stage circuit sends response signal to a succeeding-stage circuit stage by stage.

* * * * *